United States Patent [19]
Jensen et al.

[11] Patent Number: 5,896,271
[45] Date of Patent: Apr. 20, 1999

[54] INTEGRATED CIRCUIT WITH A CHIP ON DOT AND A HEAT SINK

[75] Inventors: Eric Dean Jensen, Irvine; William R. Crumly, Anaheim; Haim Feigenbaum, Irvine; Chris M. Schreiber, Lake Elsinore, all of Calif.

[73] Assignee: Packard Hughes Interconnect Company, Irvine, Calif.

[21] Appl. No.: 08/897,584

[22] Filed: Jul. 21, 1997

[51] Int. Cl.⁶ .................................................. H05K 7/20

[52] U.S. Cl. ........................ 361/719; 361/706; 361/764; 361/718; 257/692; 257/712; 257/713; 438/122; 174/252; 174/256; 174/16.3; 165/80.3

[58] Field of Search ........................ 361/704, 719, 361/385, 764, 260, 16.3; 29/834, 840, 838; 357/74; 257/700–713, 680, 692, 698, 717, 687, 725, 690; 174/260, 16.3; 165/185, 80.3, 80.2, 165; 438/122; 216/20

[56] References Cited

U.S. PATENT DOCUMENTS

| 5,045,921 | 9/1991 | Howard et al. | 357/34 |
| 5,161,090 | 11/1992 | Crawford et al. | 361/385 |
| 5,467,251 | 11/1995 | Katchmar | 361/719 |
| 5,708,566 | 1/1998 | Hunninghous et al. | 361/764 |
| 5,745,984 | 5/1998 | Cole et al. | 29/834 |
| 5,792,677 | 8/1998 | Reddy et al. | 438/122 |

*Primary Examiner*—Leo P. Picard
*Assistant Examiner*—Michael Datskovsky
*Attorney, Agent, or Firm*—Cary W. Brooks

[57] ABSTRACT

Disclosed is a flexible substrate having a thermal contact that provides a continuous high thermal conductivity path from a heat generating component to a heat sink. In one embodiment, the thermal contact includes a metallic trace including a raised feature of thermally conductive material. A solder ball or fillet may be used to make a connection between the raised feature and the heat generating component or between the raised feature and the underlying heat sink or both.

25 Claims, 3 Drawing Sheets

INTEGRATED CIRCUIT WITH A CHIP ON DOT AND A HEAT SINK

TECHNICAL FIELD

This invention relates to devices having a flexible substrate with metallic raised features.

BACKGROUND OF THE INVENTION

Flexible circuits have been used to carry heat generating components such as integrated circuit chips and power switching applications because the thin flexible circuits can provide a short path to an underlying heat sink. In such systems, "dummy" thermal solder bumps are applied to the chips and soldered to the flexible circuits to provide a heat path from the integrated circuit chip to the flexible circuits. Thermal vias are then provided through the flexible circuits by way of copper through holes to the bottom surface of the flexible circuits. The flexible circuit is then bonded to a heat sink using a thermal adhesive which is a resin filled with thermally connective material. However, the greatest resistance to heat flow in the system that is the thermal adhesive which has a relatively low coefficient of thermal conductivity.

The present invention provides alternatives and advantages over the prior art.

SUMMARY OF THE INVENTION

The present invention includes a flexible substrate having a thermal contact that provides a continuous high thermal conductivity path from a heat generating component to a heat sink. In one embodiment, the thermal contact includes a metallic trace and a raised feature of a thermally conductive material. A solder ball or fillet may be used to make a connection between the raised feature and the heat generating component or between the raised feature and the underlying heat sink or both. In another embodiment, the raised feature is used to penetrate through a relatively low thermal conductivity adhesive layer that holds the flexible substrate to the heat sink. Thus the present invention provides a high thermal conductivity path from the heat generating device to the heat sink and eliminates the thermal barrier associated with the adhesive layer.

Another embodiment of the present invention includes a flexible circuit with a plurality of metal traces and raised features. A first metal trace having a raised feature is used to make electrical connection to a heat generating component, and a second metal trace having a raised feature is used to provide a continuous high thermal conductivity path from the heat generating component to an underlying heat sink.

Another embodiment of the present invention includes a flexible substrate with a metallic trace have first and second raised features extending in opposite directions that are used to provide a high thermal conductivity and/or electrical path between a heat generating component and a heat sink.

Another embodiment of the present invention includes a flexible circuit with a metallic trace and raised feature. The same metallic trace and raised feature is used to provide an electrical path and a high thermal conductivity path between a heat generating component and a heat sink. In this case, the heat sink is used to supply electricity to the heat generating component.

These and other objects, features and advantages of the present invention will become apparent from the following brief description of the drawings, detailed description and appended claims and drawings.

DESCRIPTION OF THE PREFERRED EMBODIMENT

Figure 1:
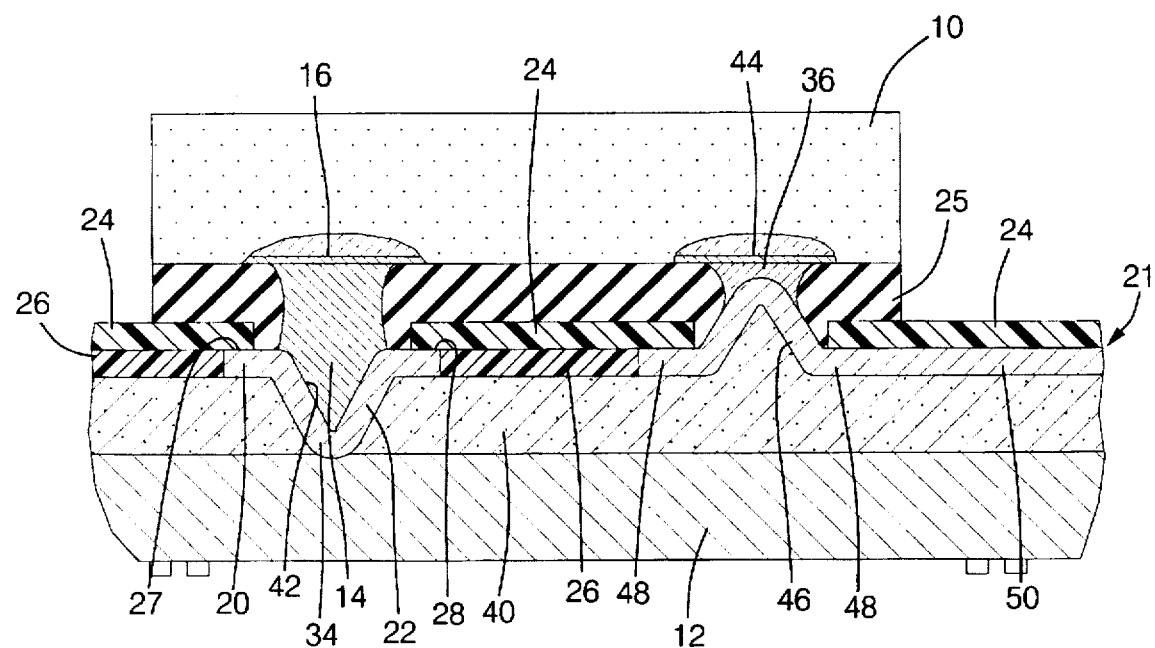
FIG. 1 is a sectional view illustrating a flexible substrate with a thermal contact according to the present invention and including a raised feature making direct contact with a heat sink.

In the discussion of the various embodiment of this invention, the same numerals are used to describe substantially identical structural features. As illustrated in the drawings, the present invention includes a heat generating component 10 and a flexible substrate 21 with metal traces 20 for making thermal and/or electrical connection to the heat generating component. The flexible substrate with metal traces may be made by a variety of methods. One such method is disclosed in Crumly at al U.S. Pat. No. 5,207,887, the disclosure of which is hereby incorporated by reference. The method produces a flexible substrate with metal traces having a raised feature portion. The Crumly et al method will be generally described at the end of this disclosure. Alternatively, a raised feature can be mechanically created from a flat flexible substrate having metallic or electrical traces defined therein and associated contact pads. A mechanical tool is pushed into the contact pad to produce the raised feature.

In one embodiment of the present invention illustrated in FIG. 1, a heat generating component 10 is connected to an underlying heat sink 12. A heat generating component 10 may be, for example, a semiconductor device such as an integrated circuit chip, a high frequency power device, a light, a vacuum tube, a relay, a capacitor, a resistor (particular one with a high aspect ratio) or any other component that generates and needs to dissipate heat during operation, particularly a component used in an electronic circuit. The heat generating component can be carried by the flexible substrate 21 or may be on a circuit board, ceramic substrate or other device. Hereafter the heat generating component may be occasionally referred to as an integrated circuit chip.

A flexible substrate 21 is provided having two substantially flat layers 24, 26 that may be made from any suitable flexible electrical insulation material such as polyimide. A metallic trace 20 is carried by the flexible substrate 21 and includes a raised feature 22 formed therein and extending out of the plane of one of the substantially flat layers 24, 26.

An underfill material 25 may be provided between the integrated chip 10 and the flexible substrate 21.

In the embodiment of FIG. 1, the raised feature 22 extends from the lower layer 26 toward the underlying heat sink 12. A solid adhesive layer 40 is used to secure the lower layer 26 to the underlying heat sink 12. Although the adhesive layer 40 may be filled with a thermally conductive material, the adhesive layer 40 has a relatively low thermal conductivity to that of the metallic trace 20 or solder fillet 14, 36 (described hereafter). For example, an adhesive layer 40 may have a thermal conductivity less than 1 watt/m°K, and usually about 0.15–0.35 watts/m°k, as compared to the thermal conductivity for typical solder composition which is about 40–65 watts/m°K, and a metallic trace material such as copper which is 398 watts/m°K.

Preferably the raised feature 22 has a conical shape and includes an apex 34 so that when the flexible substrate 21 is pushed toward the heat sink 12, the raised feature 22 easily penetrates through the solid adhesive layer 40 to make physical contact with the heat sink 12. A solder ball or fillet 14 connects a contact pad 16 of the integrated circuit chip 10 to the metallic trace 20. Preferably the solder fillet 14 is secured to a dimple side (underside) 42 of the raised feature 22. The metal trace 20 may be truncated at both ends 27, 28 so the metal trace 20 does not run a substantial distance along the length of flexible substrate layers and so that the ends 27, 28 of the metal trace may be electrically isolated by either of the flexible layers 24, 26. That is, the metal trace 20 is surrounded by the flexible layer(s) 24, 26 to electrically isolate the trace 20 from other circuit components.

Thus, the advantages of the present invention illustrated in FIG. 1 are achieved by the solder fillet 14 and raised feature 22 that provide a continuous high thermal conductivity path between the heat generating component 10 and the underlying heat sink 12 thus eliminating the heat transfer barrier previously associated with the relatively low thermal conductivity of the adhesive layer 40.

Figure 2:
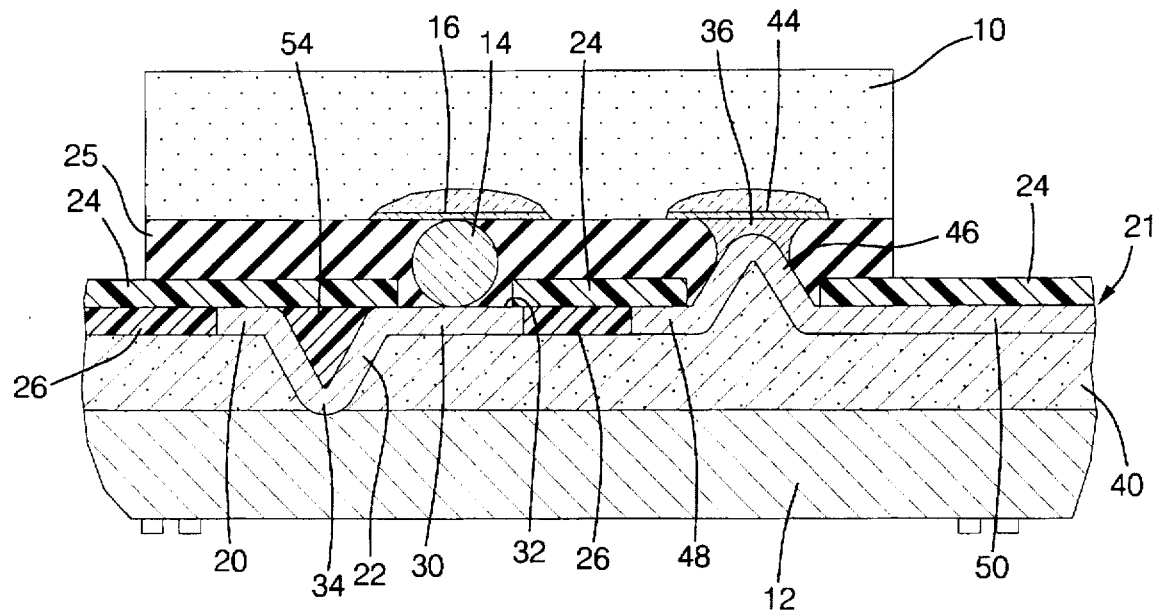
FIG. 2 is a sectional view illustrating a flexible substrate with a thermal contact according to the present invention and including a raised feature making direct contact with a heat sink and an extension portion for connecting to a heat generating component.

In a second embodiment of the present invention illustrated in FIG. 2, a metallic trace 20 is provided including a raised feature 22 and a flat extension portion 30. A solder ball or fillet 14 is secured to an upper surface 32 of the extension portion 30. Another end of the solder ball or fillet 14 is secured to a contact pad 16 on the underside of the integrated circuit chip 10 as described above. The solder fillet 14, extension portion 30 and raised feature 22 provide a continuous high thermal path from the heat generating component 10, to the underlying heat sink 12.

Figure 3:
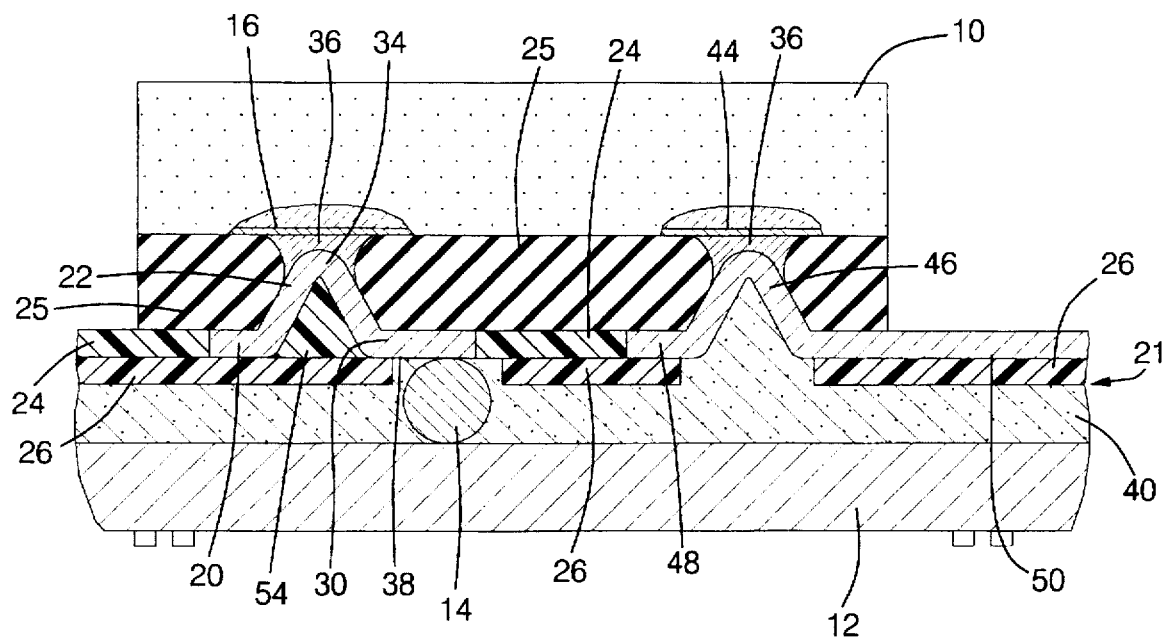
FIG. 3 is a sectional view illustrating a flexible substrate with a thermal contact according to the present invention and including a raised feature connected to a heat generating component and an extension portion for connecting to a heat sink.

In a third embodiment of the present invention illustrated in FIG. 3, again, a metallic trace 20 is provided including a raised feature 22 and a flat extension portion 30. However, the raised feature 22 extends above the flat surface of the upper layer 24 so that the apex 34 of the raised feature 22 is connected to the contact pad 16 on the integrated circuit chip by a smaller solder fillet 36. A larger solder ball 14 connects an underside 38 of the flat extension portion 30 to the underlying heat sink 12. When the flexible layer 26 is secured to the underlying heat sink by a solid adhesive layer 40, sufficient pressure is applied to the flexible substrate 21 to cause the larger solder ball or fillet 14 to be pushed through the solid adhesive layer 40. However, a substantial amount of pressure is required to push the solder ball 14 through the adhesive layer and may result in the ball becoming squashed (not illustrated). Alternatively, an aperture may be formed in the adhesive layer 40 at a location corresponding to the larger solder ball or fillet 14 to facilitate connection between the metallic trace 20 and the underlying heat sink 12 without having to push the larger solder ball 14 through a solid adhesive layer.

Figure 4:
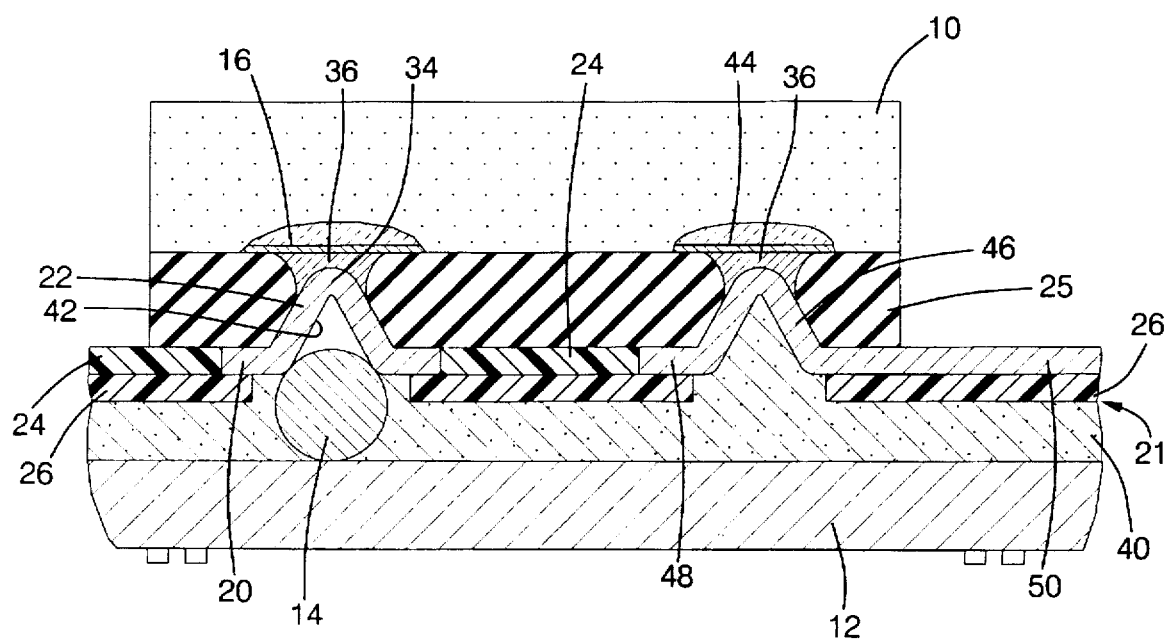
FIG. 4 is a sectional view illustrating a flexible substrate with a thermal contact according to the present invention and including a raised feature connected to a heat generating component and a heat sink.

In a fourth embodiment of the present invention illustrated in FIG. 4, again, a metallic trace 20 with a raised feature 22 is provided. The apex 34 of the raised feature 22 is connected to the contact pad 16 on the underside of the integrated circuit chip 10 by a small solder fillet 36. A larger solder ball 14 connects the dimpled side (underside) 42 of the raised feature 22 formed in the metallic trace 20 to the underlying heat sink 12. Again, a substantial amount of pressure is applied to the flexible substrate 21 causing the large solder fillet or ball 14 to become squashed (not illustrated).

Figure 5:
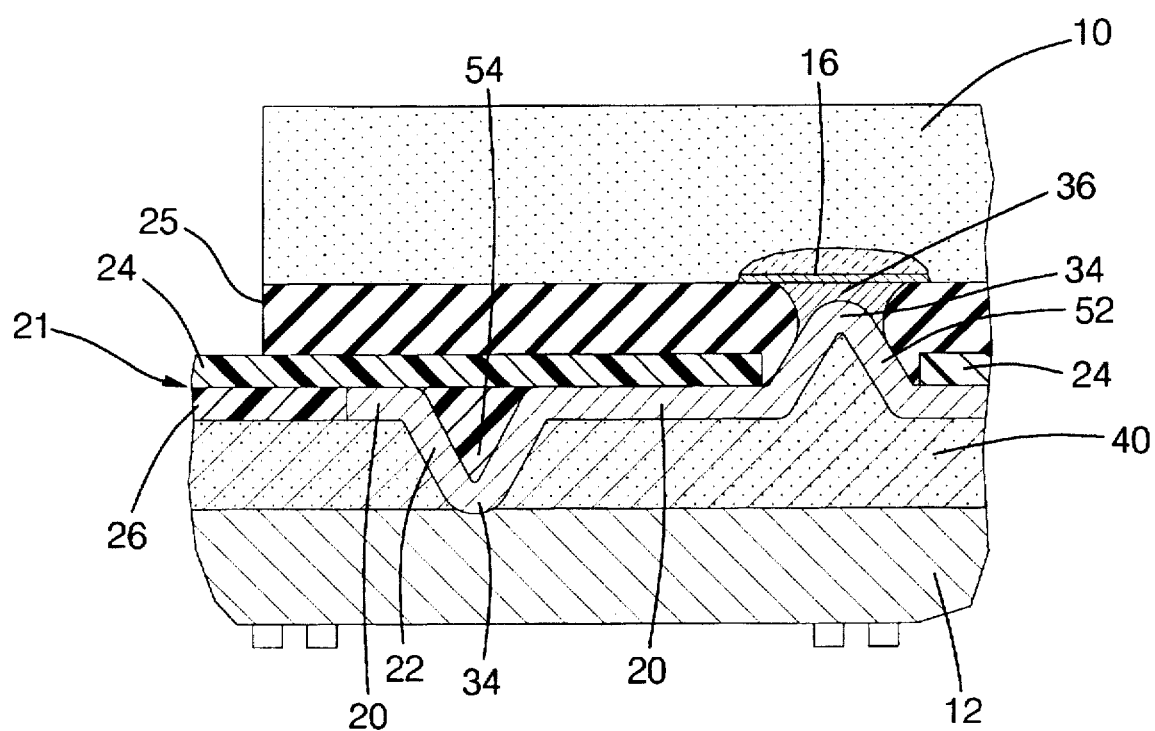
FIG. 5 is a sectional view illustrating a flexible substrate with a thermal contact according to the present invention and including two raised features providing a high thermal conductivity path between a heat generating component and a heat sink.

In a fifth embodiment of the present invention illustrated in FIG. 5, a metallic trace 20 is provided with a first raised feature 22 extending in a first direction perpendicular to the plane of the flexible substrate layers 24, 26 through an adhesive layer 40 to make contact with an underlying heat sink 12. The same metallic trace 20 includes a second raised feature 52 extending in an opposite direction to the first raised feature 22 and toward the heat generating component 10. The second raised feature 52 is secured to a contact pad 16 on the heat generating component 10 by a smaller solder fillet 36. Raised features 22, 52 extending in opposite directions can be produced by mechanical means as described above, or by a mandrel method. A suitable mandrel method is set forth in Swarbrick et al, "Mandrel for Producing Circuits with Raised Features Protruding from Two Surfaces and Methods of Making and Using the Same", U.S. Ser. No. 08/698,408, filed Aug. 15, 1996, the disclosure of which is hereby incorporated by reference.

Referring now to FIGS. 1–4, a unique aspect of the present invention is that the continuous thermal conductivity path between the heat generating component 10 and the heat sink 12 can be provided on a flexible substrate which also includes metallic traces and raised features for making electrical connection to the heat generating device 10. For example, a second contact pad 44 may be provided on the integrated circuit chip 10. A third raised feature 46 formed in a second metal trace 48 is secured to the second contact pad 44 by a smaller solder fillet 36. The second metallic trace 48 includes a substantially long extension portion 50 for making electrical connection to a variety of components such as a power supply positioned at a distance from the third raised feature 46. Thus, the same flexible circuit 21 utilized to make electrical connection to the integrated circuit chip 10 can also include the above described metal trace 20 and raised feature 22 to make a continuous high thermal conductivity path between the heat generating component 10 and the underlying heat sink 12.

Alternatively, a metal trace 20 with a raised feature 22 may be utilized to make both electrical connection to the heat sink 12, and provide a continuous high thermal conductivity path from the heat generating component 10 to the underlying heat sink 12. In this case, electricity is provided through the underlying heat sink 12 to the metal trace 20 with the raised feature 22 (and optionally solder fillet 14) and on to the contact pad 16 of the heat generating component 10. The same metal trace 20 with the raised feature 22 provides a continuous thermal conductivity path to an underlying heat sink 12 to dissipate heat from the heat generating component 10.

A suitable solder composition for the ball or fillet is known to those skilled in the art and may include a tin-lead combination in a weight ratio of 60/30 percent. The solder when applied to the flexible circuits may have a height ranging from less than a mil to several mils. The solder fillet may take on a variety of shapes encompass to flow using techniques known to those skilled in the art. A suitable adhesive material may include Pyralax and is available from DuPont Company. A suitable underfill material may be a silicon-filled epoxy.

A flexible circuit having raised features may be made by a variety of methods, one of which is described in Crumly et al U.S. Pat. No. 5,207,807, entitled "Semi-additive Circuitry with Raised Features Using Formed Mandrels", issued May 4, 1993, the disclosure of which is hereby incorporated by reference. The Crumly et al process is briefly describe hereafter.

A stainless steel plate forms a mandrel having a forming surface in which is provided one or a plurality of depressions or dimples, which will define raised features of the resulting circuitry. The mandrel and its depression or depressions is then coated with a copper coating, typically referred to as flash plated, which covers the entire surface of the mandrel, including the surface of the depressions. The flash plated copper is applied by electroplating or other known techniques and provides a thin conductive coating that prevents the adhesive (that will be used to laminate the circuit substrate) from adhering to the mandrel surface. Flash plating is a conventional electrolytic plating formed in a very short or momentary operation so that only a very thin plating coat is provided. The flash plated coat is thin compared to the thickness of the metallic or electrical circuit traces that are to be made. For example, for a metallic or electrical circuit trace will have a 1½ mil thickness, and a flash plating of copper on the mandrel will have a thickness of 0.01–0.2 mils. The thin flash plating is employed because it can be relatively easily released from the stainless steel mandrel, and in addition, may be readily removed from the lamination after separation from be mandrel by a flash etching, which is unfairly short time or momentary etching process. Obviously, other methods of coating the mandrel with a very thin coat of conductive material that is readily separate from the mandrel and which can be thought readily removed from the completed metallic or electrical circuit traces maybe employed in the place of the electrolytic flash plated. Such methods include sputtering, vapor deposition and electroless plated. If deemed necessary or desirable, the mandrel may be made of a non-electrically conductive material because the then electrically conductive coating itself enables the additive electroforming of the circuit traces and raised features. The coating, for a dielectric mandrel, can be applied by electroless plating, sputtering, or other materials. The flash plated copper is coated with a photoresist, which is then optically expose through a mask defining a pattern of the desired metallic traces or electric circuit and developed. The photoresist that has but been polymerized is then removed to leave the partially completed assembly. The flash plated copper, now bears a pattern of photoresist that is an additive pattern of the metallic or electric circuit trace pattern to be fabricated with this mandrel.

The mandrel assembly is then subjected to a simple additive electroforming process, such as, for example, electroplating, to plate up copper traces, including a traces with a raised feature pad, creating a feature in the depression. The copper traces are plated directly onto those portions of the flash plated copper, that are not covered by be negative pattern of the developed photoresist. Thus the plating process simultaneous the forms both the metallic or electrical circuit traces, and the raised features. The raised features are partly hollow, having a depression or dimples on an underside. If deemed necessary or desirable, the depression formed in the electroplating raised feature may be filled with a solid material such as approximately by placing a drop of the epoxy or other suitable material 54 in the depression and following the epoxy to cure.

The photoresist is then stripped to leave the traces and raised features on the flash plated copper coating which is still on the mandrel. Now a layer of suitable dielectric and adhesive, such as, for example, a layer of Kapton an adhesive, are laminated to the mandrel assembly with the traces and raised features thereon under suitable high temperatures and pressures. This causes the Kapton® and adhesive such as Pyralax® to flow into the spaces between the traces and thereby contact traces and pads on three sides. Only that side of the traces and pads that are directly in contact with the flash plated copper on the mandrel are not contacted with the adhesive substrate. The assembly now includes the mandrel, the flash plated copper, traces, pads and raised features and the Kapton/adhesive substrate.

The circuit assembly is then removed from the mandrel. Because only the flash plated copper contacts the mandrel, this may be readily separated, and no adhesive of the substrate is in contact with the mandrel. Thus it will be seen that because the mandrel has been initially coated with the protective layer of the flash plated copper, the assembly of dielectric/adhesive substrate, metallic and electric circuit traces and raised features can be readily separated from the mandrel, which together with the flash plated copper coating.

After separation from the mandrel, the flash plated copper coating, which covers the entire lower surface of the assembly, is removed by a flash etching process to yield the finished or substantially finished sub-assembly. The sub-assembly is ready for the coverlay lamination, which comprises the standard process for covering at least the side of the substrate bearing the metallic and electrically conductive traces with an adhesive coverlay.

If deemed necessary or desirable, the removal of a flash plated copper coating me be controlled by a "stop" layer of gold and/or nickel, which will protect the thicker copper circuit during flash etch removal of the flash plated copper. To this end, the flash coated mandrel with its photolithographically defined resist pattern in place, may be plated with a thin layer of gold, about 0.000006 inches thick, upon which the circuitry will be plated. This patterned gold "stop" layer allows the flash plated copper to be removed by the flash etching from the dielectric, but protects the copper circuit.

We claim:

1. An electronic device comprising:
   a heat generating component and a flexible substrate secured to a heat sink by an adhesive layer;
   said flexible substrate further including a thermal contact extending through the adhesive layer and comprising a metallic trace and a first raised feature of thermally conductive material extending outwardly from a face of the flexible substrate, said thermal contact being connected to the heat generating component and the heat sink to provide a heat conduction path from the heat generating component to the heat sink and wherein said metallic trace and first raised feature are constructed of the same material and the first raised feature has a generally conical shape.

2. An electronic device as set forth in claim 1 wherein said metallic trace and first raised feature comprise a continuous layer comprising copper.

3. An electronic device as set forth in claim 1 further comprising an adhesive layer securing the flexible substrate to the heat sink.

4. An electronic device as set forth in claim 3 wherein the adhesive layer has a thermal conductivity less than 1 watt/m°K.

5. An electronic device as set forth in claim 1 wherein the first raised feature has a thermal conductivity greater than 1 watt/m°K.

6. An electronic device as set forth in claim 1 wherein the first raised feature has a thermal conductivity greater than 40 watts/m°K.

7. An electronic device as set forth in claim 1 wherein the thermal contact is connected to the heat generating component and the heat sink to provide a thermal conductivity of greater than 40 watts/m°K along the entire heat conduction path.

8. An electronic device as set forth in claim 7 wherein the first raised feature makes direct contact with the heat sink.

9. An electronic device as set forth in claim 7 wherein a solder material is interposed between the thermal contact and the heat sink.

10. An electronic device as set forth in claim 7 wherein a solder material is interposed between the thermal contact and the heat generating component.

11. An electronic device as set forth in claim 1 wherein the flexible substrate includes first and second opposite faces, and wherein the first raised feature extends from the first face, and further comprising a second generally conical shaped raised feature extending from the second face.

12. An electronic device as set forth in claim 1 wherein the thermal contact is connected to the heat generating component by a solder fillet extending between an apex of the first raised feature and the heat generating component.

13. An electronic device as set forth in claim 1 wherein the thermal contact is connected to the heat generating component by a solder fillet extending between an underside of the first raised feature and the heat generating component.

14. An electronic device as set forth in claim 1 wherein the metallic trace includes an extension portion running a distance from the first raised feature, and wherein the thermal contact is connected to the heat generating component by a solder fillet extending between the extension portion and the heat generating component.

15. An electronic device as set forth in claim 1 wherein the metallic trace includes an extension portion running a distance from the first raised feature, and wherein the thermal contact is connected to the heat sink by a solder fillet extending between the extension portion and the heat sink.

16. An electronic device as set forth in claim 1 wherein the flexible substrate includes an electrical insulation layer, and wherein the metallic trace has two opposite ends electrically insulated by the insulation layer.

17. An electronic device as set forth in claim 1 wherein the electronic device is constructed and arranged so that electricity is provided through the heat sink and thermal contact to the heat generating component.

18. An electronic device as set forth in claim 1 wherein the flexible substrate further comprises an electrical circuit including a second metallic trace and third raised feature for making electrical contact to the heat generating component.

19. An electronic device as set forth in claim 18 wherein the second metallic trace and third raised feature comprise a continuous layer comprising copper and the third raised feature has a generally conical shape.

20. An electronic device comprising:
a heat generating component, a flexible substrate and a heat sink;
the flexible substrate further including a thermal contact comprising a metallic trace and a first metallic raised feature having a dimple side and an apex on another side, the first metallic raised feature extending outwardly from a face of the flexible substrate, a solder fillet extending between the heat generating component and the dimple side of the first metallic raised feature, and an adhesive layer securing the flexible substrate to the heat sink so that the first metallic raised feature extends through the adhesive layer and the apex contacts the heat sink.

21. An electronic device comprising:
a heat generating component, a flexible substrate and a heat sink;
the flexible substrate further including a thermal contact comprising a metallic trace and a first metallic raised feature having a dimple side and an apex on another side, the first raised feature extending outwardly from a face of the flexible substrate, the metallic trace also including an extension portion extending a distance from the first metallic raised feature, a solder fillet extending between the heat generating component and the extension portion, and an adhesive layer securing the flexible substrate to the heat sink so that the first metallic raised feature extends through the adhesive layer and the apex contacts the heat sink.

22. An electronic device comprising:
a heat generating component, a flexible substrate and a heat sink;
the flexible substrate further including a thermal contact comprising a metallic trace and a first metallic raised feature having a dimple side and an apex on another side, the first raised feature extending outwardly from a face of the flexible substrate, the metallic trace also including an extension portion extending a distance from the first metallic raised feature, the apex being connected the heat generating component, a solder fillet extending between the heat sink and the extension portion, and an adhesive layer securing the flexible substrate to the heat sink.

23. An electronic device comprising:
a heat generating component, a flexible substrate and a heat sink;
the flexible substrate further including a thermal contact comprising a metallic trace and a first metallic raised feature having a dimple side and an apex on another side, the first raised feature extending outwardly from a face of the flexible substrate, the apex being connected to the heat generating component, a solder fillet extending between the heat sink and the dimple side of the first metallic raised feature, and an adhesive layer securing the flexible substrate to the heat sink.

24. An electronic device comprising:
a heat generating component, a flexible substrate and a heat sink;
the flexible substrate have first and second opposite faces and further including a thermal contact comprising a metallic trace and a first raised feature and a second raised feature, the first raised feature extending outwardly from the first face and the second raised feature extending outwardly from the second face of the flexible substrate, the first raised feature being connected to the heat generating component, an adhesive layer securing the flexible substrate to the heat sink so that the second raised feature extends through the adhesive layer and makes contact with the heat sink, and wherein the first and second raised feature each have a generally conical shape.

25. An electronic device as set forth in claim 24 wherein said metallic trace and first and second raised feature comprise a continuous layer of the same material comprising copper.

* * * * *